(12) United States Patent
Yamada

(10) Patent No.: US 7,688,658 B2
(45) Date of Patent: Mar. 30, 2010

(54) SEMICONDUCTOR DEVICE IN WHICH A PLURALITY OF MEMORY MACROS ARE MOUNTED, AND TESTING METHOD THEREOF

(75) Inventor: Naoki Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 12/102,561

(22) Filed: Apr. 14, 2008

(65) Prior Publication Data

US 2008/0259704 A1 Oct. 23, 2008

(30) Foreign Application Priority Data

Apr. 19, 2007 (JP) ............................. 2007-109937

(51) Int. Cl.
*G11C 7/00* (2006.01)
(52) U.S. Cl. .............. 365/201; 365/189.07; 365/189.08
(58) Field of Classification Search ................. 365/201, 365/189.07, 189.08
See application file for complete search history.

(56) References Cited

U.S. PATENT DOCUMENTS

| | | | | |
|---|---|---|---|---|
| 5,301,155 A | 4/1994 | Wada et al. | ................. | 365/201 |
| 5,982,684 A | 11/1999 | Schwartzlow et al. | ....... | 365/201 |
| 6,601,199 B1 | 7/2003 | Fukuda et al. | .............. | 714/719 |
| 6,879,530 B2 | 4/2005 | Callaway et al. | ............ | 365/201 |
| 7,013,414 B2 | 3/2006 | Takeshige et al. | ........... | 714/719 |
| 7,031,864 B2 * | 4/2006 | Matsui | ....................... | 702/117 |
| 2006/0149500 A1 * | 7/2006 | Matsui | ...................... | 702/176 |

FOREIGN PATENT DOCUMENTS

| | | |
|---|---|---|
| JP | 63-241791 | 10/1988 |
| JP | 1-307853 | 12/1989 |
| JP | 4-7868 | 1/1992 |
| JP | 05-020899 | 1/1993 |

* cited by examiner

*Primary Examiner*—Son Dinh
(74) *Attorney, Agent, or Firm*—Steptoe & Johnson LLP

(57) ABSTRACT

According to the present invention, an intra-macro match determining circuit 111 internally determines whether or not n test outputs from each macro all have the same level. The result of the determination is combined with some of the test outputs, and the resultant signal is output to a tester. Thus, the determination result for a match is combined with the test outputs instead of a particular value. Consequently, the same expected value can also be used for individual macro testing, and output bits are assigned to each of the macros. Therefore, in internally performing a comparison with the expected value, the tester can easily detect defective macros.

17 Claims, 16 Drawing Sheets ated above, performs the testing with the n+1 bits, increasing the number of terminals required for the testing compared to that in the conventional example 1.

SEMICONDUCTOR DEVICE IN WHICH A PLURALITY OF MEMORY MACROS ARE MOUNTED, AND TESTING METHOD THEREOF

FIELD OF THE INVENTION

The present invention relates to a semiconductor device in which a plurality of memory macros are mounted, and a testing method thereof.

BACKGROUND OF THE INVENTION

As a conventional semiconductor device, a semiconductor device will be described below in which four memory macros each having an n-bit test output terminal are mounted. In the description below, by way of example, the memory macros are individually tested by means of direct memory access (DMA).

FIG. 15 is a block diagram showing the configuration of an essential part of a semiconductor device in a conventional example 1 (testing is performed on each memory macro). As shown in FIG. 15, memory macros 1501 to 1504 are provided. First, to test the memory macro 1501, a tester 1509 inputs a test input signal TDIi (i=1 to n; here, n=8) to the memory macro 1501 or all the memory macros 1501 to 1504 through a pad 1510.

During a write operation set by the tester 1509, the memory macro 1501 receives the test input signal TDIi (i=1 to 8), which is written to each memory cell in the memory macro 1501. During a read operation set by the tester, data is read from the memory cells, and a test output signal TDO1i (i=1 to 8) is output from the memory macro 1501.

The test output signal TDO1i is output to the tester 1509 through a selector 1511 and a pad 1512, and compared, in the tester 1509, with an expected value that is a comparison reference value. On the basis of the result of the comparison, the tester 1509 makes a PASS/FAIL determination. The above-described operation is also performed on the memory macros 1502 to 1508.

In the above-described case, the testing is performed on each memory macro, and the time required for the testing thus increases with the number of memory macros. To solve this problem, a proposal has been made of a method of simultaneously testing a plurality of memory macros, which corresponds to a conventional example 2 (see, for example, Japanese Patent Laid-Open No. 2000-133000).

FIG. 16 is a block diagram showing the configuration of an essential part of a semiconductor device in conventional example 2 (a plurality of memory macros are simultaneously tested). In this semiconductor device, as shown in FIG. 16, four outputs TDO1i to TDO4i (i=1 to 8) are simultaneously output by the memory macros and passed through an output synthesizing circuit (AND circuit) 1601. The output synthesizing circuit 1601 subjects the outputs to data compression to output a resulting test output signal CTDOi (i=1 to 8).

Even if any macro contains different data, this cannot be determined simply by compressing the data as described above. Thus, a comparator is used to determine whether or not the signals TDO1i to TDO4i (i=1 to 8) match to output a new PASS/FAIL signal. This one bit and n bits, that is, the n+1 bits, are used to simultaneously test the plurality of macros.

However, such a testing method of a semiconductor device as shown in the conventional example 2, described above, performs the testing with the n+1 bits, increasing the number of terminals required for the testing compared to that in the conventional example 1.

Furthermore, the data from the memory macros are compressed by the output synthesizing circuit 1601. This makes it impossible to determine which of the memory macros is defective. To determine which of the memory macros is defective, it is necessary to retest all the macros. This requires extra testing steps compared to the conventional example 1, increasing the time required to test all the macros.

Moreover, the simultaneous macro testing uses the expected value which corresponds to the comparison reference value and which is different from that used for the individual macro testing. Different test files are thus required for the expected value for the individual macro testing and for the expected value for the simultaneous macro testing. Thus, the conventional example 2 requires much time and effort to appropriately manage and use the test file required to distinguish the conventional example 2 from the conventional example 1.

DISCLOSURE OF THE INVENTION

The present invention solves the above-described conventional problems and provides a semiconductor device and a testing method thereof which, for the simultaneous testing of the plurality of memory macros, inhibits an increase in the number of testing terminals and eliminates the need to prepare the dedicated expected value test file different from the test file for the individual macro testing to avoid waste in the testing step, enabling a reliable reduction in the time required to test all the macros.

To accomplish this object, the present invention provides a semiconductor device including a plurality of memory macros and an intra-macro match determining unit outputting an intra-macro match signal corresponding to at least one of the plurality of memory macros and comparing test output data from the memory macro to determine whether or not the test output data match, the intra-macro match determining unit outputting some of the test output data from the memory macro as an output level determination signal used to determine level of the match, wherein a logic of the intra-macro match signal is determined on the basis of a logic of the output level determination signal according to a state of the match between the test output data from the memory macro.

Furthermore, the intra-macro match determining unit is provided in each of the plurality of memory macros.

Furthermore, the intra-macro match signal has the same logical value as that of the output level determination signal when the test output data from the memory macro match, and has a logical value corresponding to a reversal value of the output level determination signal when the test output data from the memory macro does not match.

The semiconductor device further has a first selector selecting the test output data from one of the plurality of memory macros and a second selector selecting from the test output data selected by the first selector and output signals from the plurality of intra-macro match determining units, in accordance with test input data.

Furthermore, as the test output data input to each of the plurality of intra-macro match determining units, the test output data from at least one of the plurality of memory macros is selected.

The semiconductor device further has an unselected macro output setting circuit selecting from the test output data from each of the plurality of memory macros and the test input data in accordance with an output macro selection signal as the test output data input to each of the plurality of intra-macro match determining units, and the unselected macro output setting circuit selects the test input data as the test output data input to the intra-macro match determining units corresponding to the unselected memory macros, in accordance with the output macro selection signal.

The semiconductor device further has a decoder generating an output macro selection signal selecting any one of the plurality of memory macros on the basis of an output macro selection pre-signal made up of bits the number of which is smaller than that of all the memory macros, and a selector selecting output signals from one of the plurality of intra-macro match determining units or the test output data from the selected memory macro in accordance with the output macro selection signal from the decoder.

Furthermore, a testing method of the semiconductor device includes the steps of using a tester to simultaneously test all of a plurality of memory macros on the basis of output signals from a plurality of intra-macro match determining units, allowing the tester to internally perform a comparison with an expected value that is a threshold for determining acceptability of the memory macros, selecting only the memory macro determined to have a defect on the basis of a result of the comparison, in accordance with an output macro selection signal, and on the basis of test output data output from the selected memory macro, individually testing only the selected memory macro for redundancy relief.

The semiconductor device further includes an intra-macro and inter-macro match determining unit outputting an intra-macro and inter-macro match signal corresponding to each of the memory macros other than the at least one memory macro and comparing the test output data from the at least one memory macro with at least one of the test output data from a comparison target memory macro that is different from the at least one memory macro to determine whether or not the test output data from the at least one memory macro match the test output data from the comparison target memory macro, and a logic of the intra-macro and inter-macro match signal is determined on the basis of the logic of the output level determination signal according to a state of match between the test output data from the at least one memory macro and the test output data from the comparison target memory macro.

Furthermore, the intra-macro and inter-macro match signal has the same logical value as that of the output level determination signal when the test output data from the at least one memory macro match the test output data from the comparison target memory macro, and has a logical value corresponding to a reversal value of the output level determination signal when the test output data from the at least one memory macro does not match the test output data from the comparison target memory macro.

Furthermore, the test output data from the comparison target memory macro subjected to match determination by the intra-macro and inter-macro match determining unit is some of the test output data from the comparison target memory macro which is output by the intra-macro match determining unit as the output level determination signal.

Furthermore, the comparison target memory macro is positioned in a center of the plurality of memory macros.

Furthermore, the test output data from the comparison target memory macros subjected to match determination by the intra-macro and inter-macro match determining unit is nearby test output data output from an adjacent memory macro.

Furthermore, the plurality of memory macros are n (n is an even number) memory macros arranged in one of a vertical direction and a horizontal direction, and the at least one of the plurality of memory macros is one of n/2−1th to n/2+1th memory macros from the memory macro located at an end.

Furthermore, the plurality of memory macros are n (n is an odd number) memory macros arranged in one of a vertical direction and a horizontal direction, and the at least one of the plurality of memory macros is one of (n−1)/2th to (n+1)/2th memory macros from the memory macro located at an end.

As described above, according to the present invention, when the plurality of memory macros are simultaneously tested, the number of test terminals required may be the same as that required for the individual macro testing. Furthermore, the macros are checked for defects during the simultaneous testing, making it possible to eliminate the need to retest all the macros for defects. Moreover, the testing can be achieved using a test file with the same expected value as that for the individual macro testing.

Thus, for the simultaneous testing of the plurality of memory macros, the present invention inhibits an increase in the number of testing terminals and eliminates the need to prepare the dedicated expected value test file different from the test file for the individual macro testing to avoid waste in the testing step, enabling a reliable reduction in the time required to test all the macros.

DESCRIPTION OF THE EMBODIMENTS

With reference to the drawings, a specific description will be given of a semiconductor device and a testing method thereof showing embodiments of the present invention.

Embodiment 1

Description will be given of a semiconductor device and a testing method thereof according to Embodiment 1 of the present invention.

Figure 1:
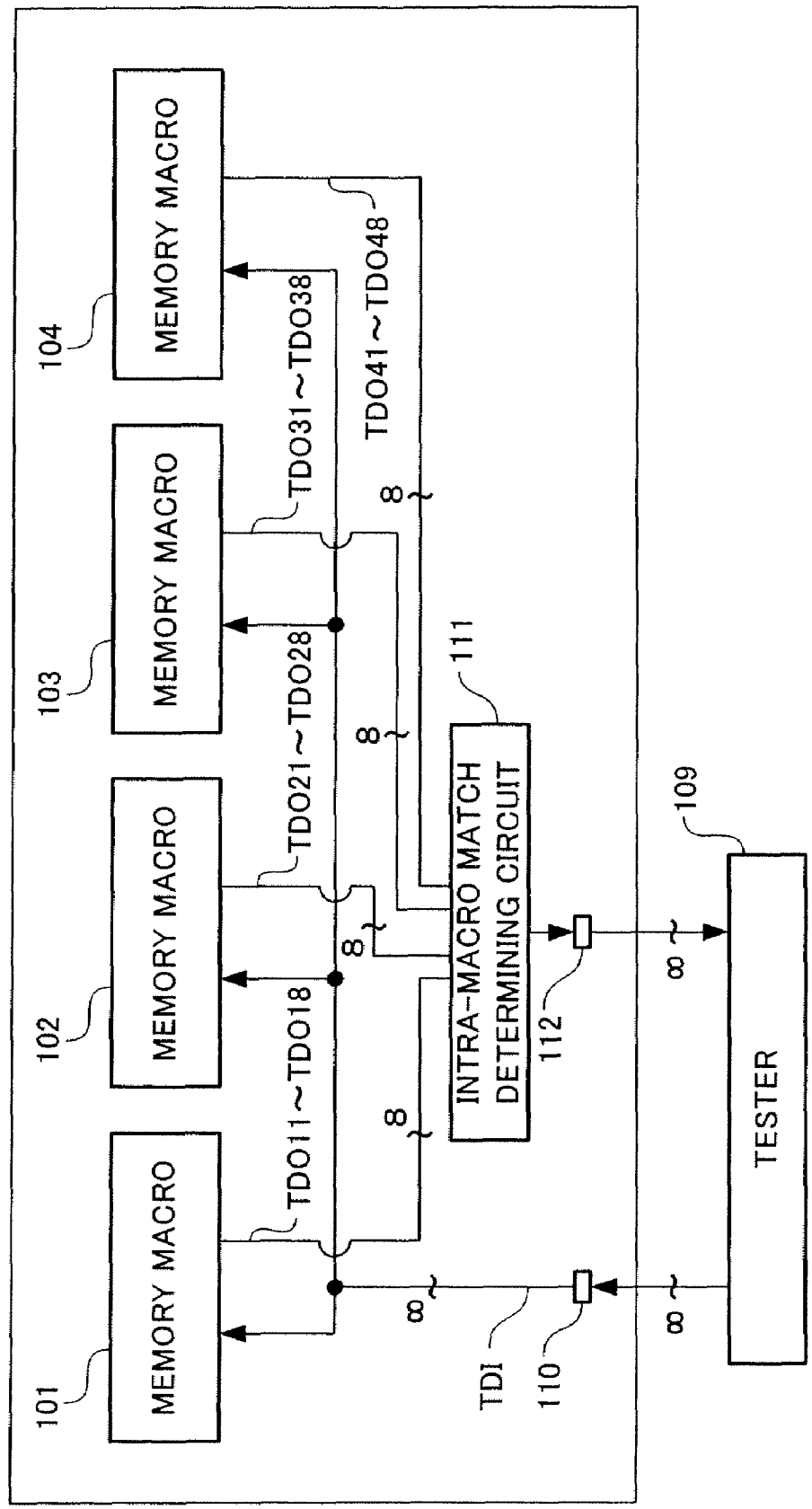
FIG. 1 is a block diagram showing the configuration of an essential part of a semiconductor device according to Embodiment 1 of the present invention.

FIG. 1 is a block diagram showing the configuration of the essential part of the semiconductor device according to Embodiment 1 of the present invention. In an example described below, testing is performed, by means of DMA, on four memory macros 101 to 104 mounted in a semiconductor device and each having an 8-bit test output terminal. The semiconductor device according to the present embodiment is composed of the memory macros 101 to 104, pads 110 and 112, and an intra-macro match determining circuit 111. A tester 109 is used to test the semiconductor device.

The tester 109 is connected to the pad 110 to input a test input signal TDIi (i=1 to 8) to each of the memory macros 101 to 104. The pad 112 outputs an output level determination signal TDOBm (m=1 to 4) from each of the memory macros 101 to 104 and an intra-macro match signal TDOCm (m=1 to 4) to the tester 109. The pad 110 inputs a test input signal TDIi (i=1 to 8) to each of the memory macros 101 to 104. An output from each of the memory macros 101 to 104 is input to the intra-macro match determining circuit 111 as test output signals TDO1$i$ to TDO4$i$ (i=1 to 8). An output of the intra-macro match determining circuit 111 is connected to the pad 112.

Figure 2:
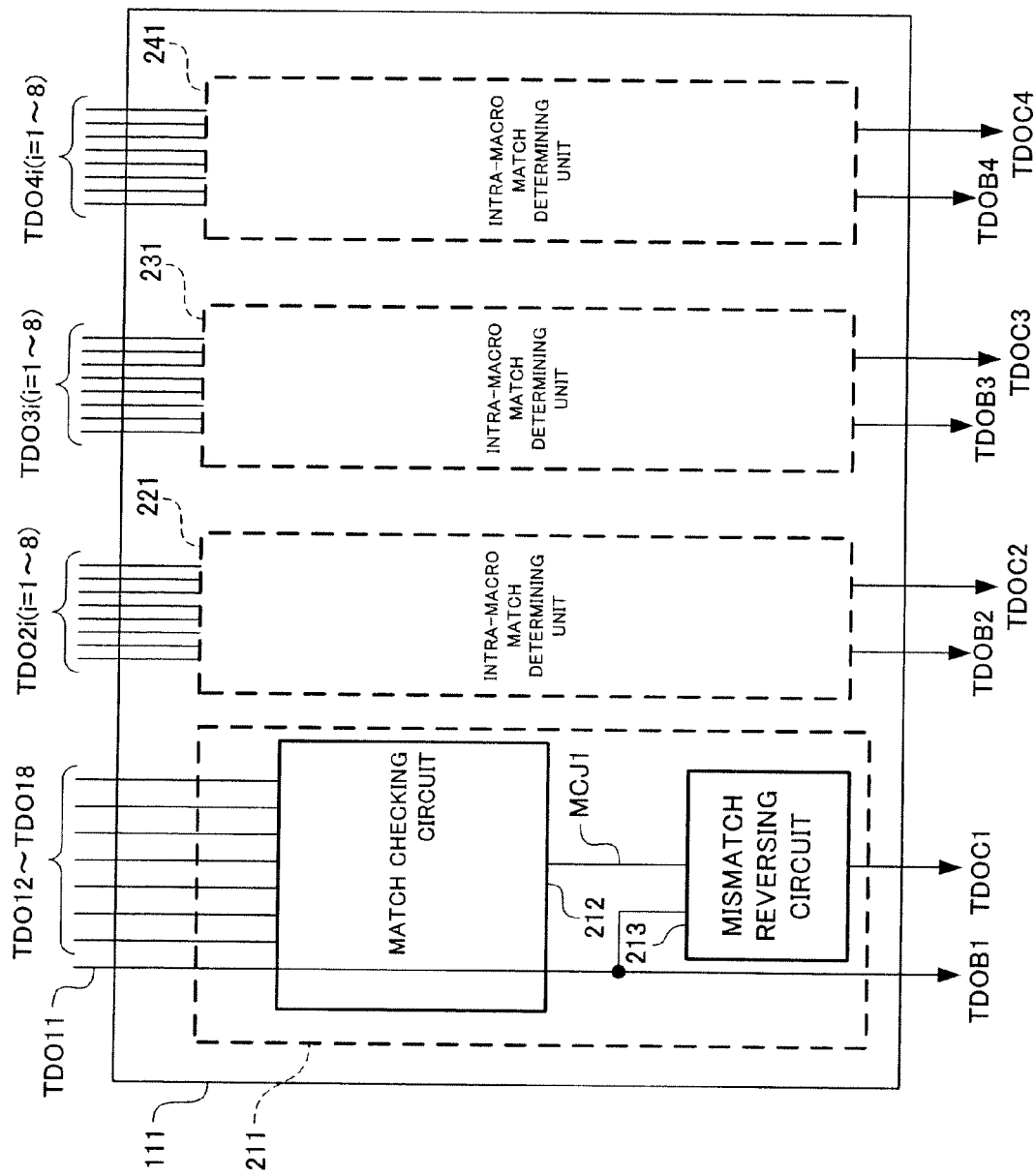
FIG. 2 is a block diagram showing the specific configuration of an intra-macro match determining circuit in the semiconductor device according to Embodiment 1.

As shown in FIG. 2, the intra-macro match determining circuit 111 is made up of as many intra-macro match determining units 2$m$1 (m=1 to 4) as the macros. Each of the intra-macro match determining units 2$m$1 is made up of a match checking circuit 2$m$2 and a mismatch reversing circuit 2$m$3.

The test output signals TDOm1 to TDOm8 (m=1 to 4) are input to the match checking circuit 2$m$2 to check for a match to output an intra-macro match determination signal MCJm. The mismatch reversing circuit 2$m$3 receives any one (here, TDOm1) of the test output signals TDOm1 to TDOm8 (m=1 to 4) and the intra-macro match determination signal MCJm as inputs. The mismatch reversing circuit 2$m$3 outputs the intra-macro match signal TDOCm.

Figure 3:
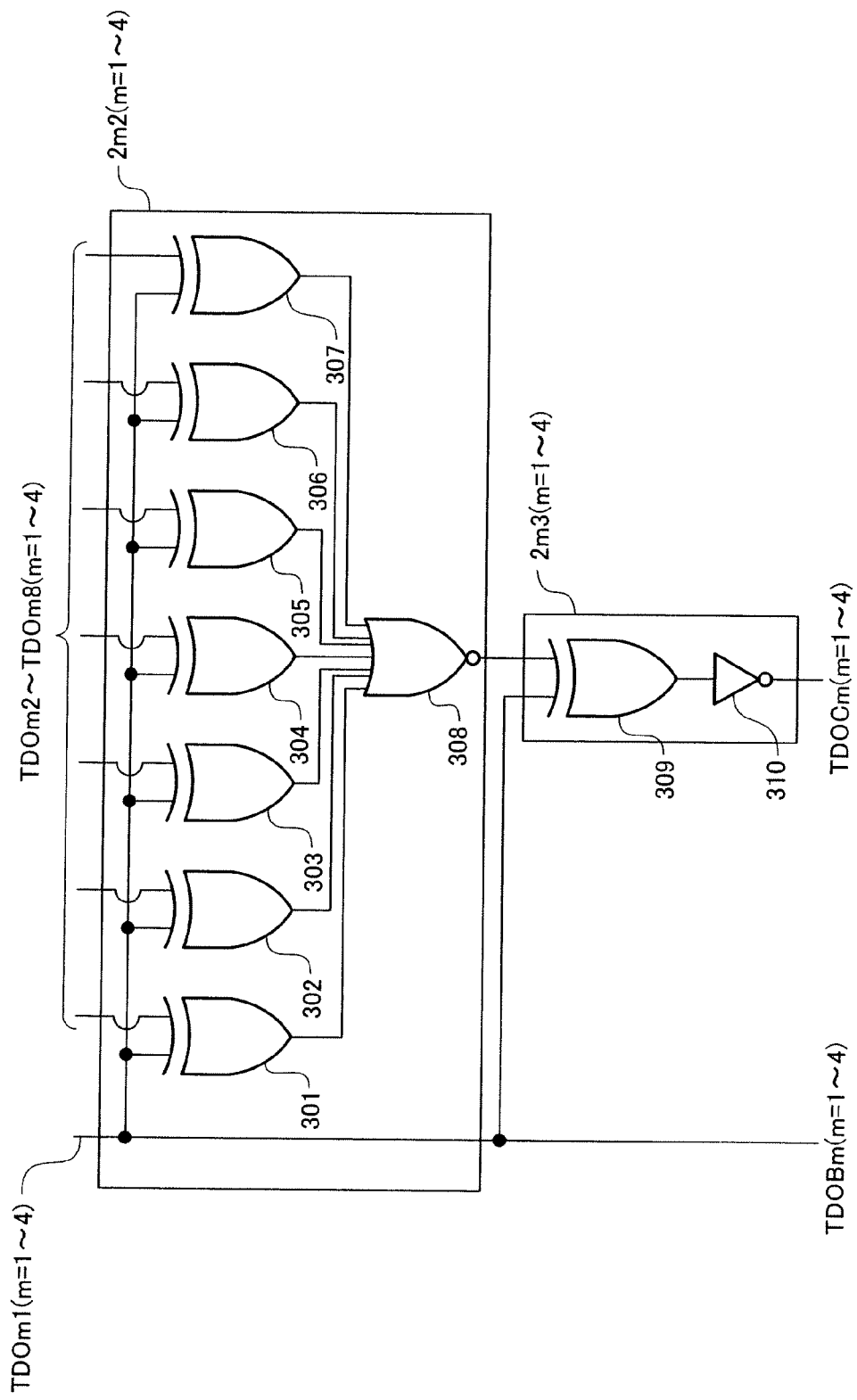
FIG. 3 is a circuit diagram showing the specific configuration of the intra-macro match determining unit in the semiconductor device according to Embodiment 1.

FIG. 3 shows a circuit diagram of the match checking circuit 2$m$2 and the mismatch reversing circuit 2$m$3. The match checking circuit 2$m$2 is made up of seven XOR circuits 30$k$ (k=1 to 7) and one NOR circuit 308. The XOR circuit 30$k$ (k=1 to 7) receives the test output signal TDOm1 and TDOm (k+1) as inputs. An output from the XOR circuit 30$k$ is input to the NOR circuit 308. An output from the NOR circuit 308 is the intra-macro match determination signal MCJm.

The mismatch reversing circuit 2$m$3 is made up of an XOR circuit 309 and an inverter 310. The test output signal TDOm1 and the intra-macro match determination signal MCJm are input to the XOR circuit 309. An output from the XOR circuit 309 is input to the inverter 310. An output from the inverter 310 is the intra-macro match signal TDOCm.

The testing method of the semiconductor device using the test circuit configured as described above is shown below.

The tester 109 uses a pattern file to output the test input signal TDIi (i=1 to n) to all the memory macros 101 to 104 through the pad 110. The memory macros 101 to 104 receive the test input signal TDIi (i=1 to 8), which is written to memory cells in the respective memory macros 101 to 104 if a write operation has been set by the tester 109. If a read operation has been set by the tester 109, data are read from the memory cells and output by the memory macros 101 to 104 as the test output signals TDO1$i$ to TDO4$i$ (i=1 to 8).

The test output signals TDOm1 to TDOm8 (m=1 to 4) from the respective macros 10$m$ are each output through the intra-macro match determining circuit 111 as two bits including the macro output level determination signal TDOBm and the intra-macro match signal TDOCm. The output level determination signal TDOBm is the output from one of the memory macros and is directly used as data. The intra-macro match signal TDOCm passes through the match checking circuit 2$m$2 and the mismatch reversing circuit 2$m$3. Then, if all data in the macro are at the same level, the same level as that of the output level determination signal TDOBm is output. If any one of the data in the macro is at a level different from that of the other macros, a level obtained by reversing the level of the output level determination signal TDOBm is output. As a result, each macro provides two results. (TDOBm, TDOCm) =(0,0) indicates that all the test outputs from that macro are zero. (TDOBm, TDOCm)=(0,1) indicates that at least one of the test outputs from the macro is 1. (TDOBm, TDOCm)=(1, 1) indicates that all the test outputs from that macro are 1. (TDOBm, TDOCm)=(1,0) indicates that at least one of the test outputs from the macro is 0. Each of the values is compared with an expected value as in the case of an individual macro testing. A mismatch between the above-described value and the expected value indicates a defect.

Since the macros output the respective results, defective macros can be easily found. Provided that at most four macros are mounted in the semiconductor device having the 8-bit test output terminals, the maximum required number of bits is eight, eliminating the need to increase the number of test terminals. Of course, the present invention is independent of the number of test output terminals. However, the maximum number of macros simultaneously tested is limited to half the number of test output terminals.

Embodiment 2

Description will be given of a semiconductor device and a testing method thereof according to Embodiment 2 of the present invention.

Figure 4:
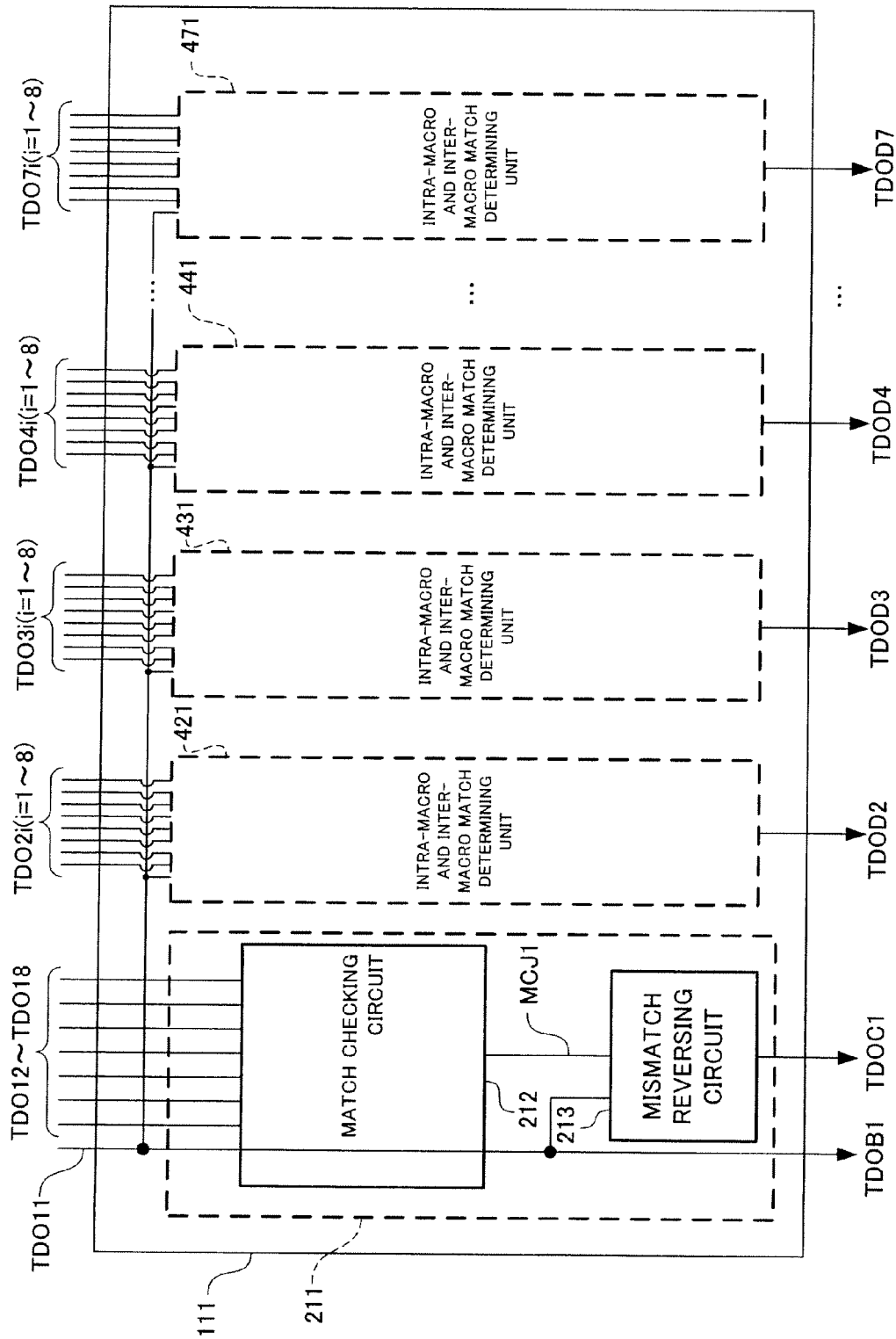
FIG. 4 is a block diagram showing the specific configuration of an intra-macro match determining circuit in a semiconductor device according to Embodiment 2 of the present invention.

FIG. 4 is a block diagram showing the specific configuration of an intra-macro match determining circuit in the semiconductor device according to Embodiment 2. Although not shown, seven macros are mounted in the semiconductor device in this example. Circuits other than the intra-macro match determining circuit 111 are similar to those in Embodiment 1 and will thus not be described below. The intra-macro match determining circuit 111 is made up of an intra-macro match determining unit 211 and six intra-macro and inter-macro match determining units 4$m$1 (m=2 to 7).

Figure 5:
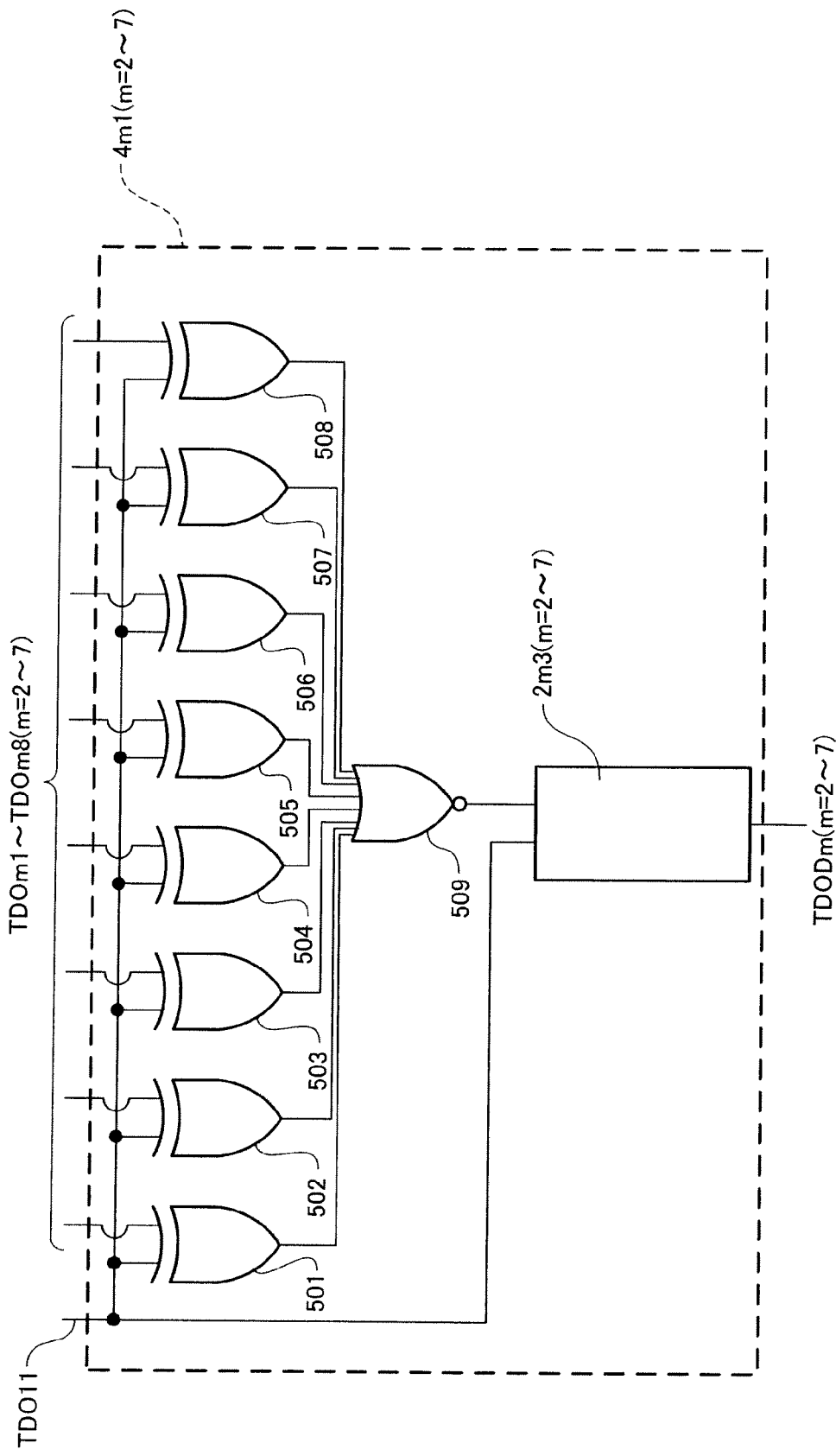
FIG. 5 is a circuit diagram showing the specific configuration of an intra-macro and inter-macro match determining unit in the semiconductor device according to Embodiment 2.

As shown in FIG. 5, the intra-macro and inter-macro match determining unit 4$m$1 is made up of eight XOR circuits 50$k$ (k=1 to 8), one NOR circuit 509, and the mismatch reversing circuit 2m3. The XOR circuit 50k (k=1 to 8) receives test output signals TDO11 and TDOmk (k=1 to 8) as inputs. An output from the XOR circuit 50k is connected to the NOR circuit 509. An output from the NOR circuit 509 and the test output signal TDO11 are input to the mismatch reversing circuit 2m3, which outputs an intra-macro and inter-macro match signal TDODm.

Embodiment 2 is different from Embodiment 1 in that the maximum number of macros mounted in Embodiment 2 is greater than that in Embodiment 1 and in that memory macros 102 to 107 each output only the intra-macro and inter-macro match signal TDODm to the tester.

The testing method of the semiconductor device using the test circuit configured as described above according to Embodiment 2 is shown below. Also for the method, all the components other than a match checking circuit 212 are similar to the corresponding components of Embodiment 1 and will thus not be described below.

For the memory macro 101, the intra-macro match determining circuit 111 outputs an output level determination signal TDOB1 and an intra-macro match signal TDOC1 to a pad 112 as is the case with Embodiment 1. For the memory macros 102 to 107, the intra-macro match determining circuit 111 not only checks whether or not the test output signals from each of the memory macros match but also checks for a match with the test output signal from the comparison target memory macro, that is, the test output signal TDO11 output by the intra-macro match determining unit 211 as the output level determination signal TDOB1. The intra-macro match determining circuit 111 outputs an intra-macro and inter-macro match determination signal MMCJm.

As is the case with Embodiment 1, the intra-macro match determining circuit 111 outputs the same level as that of the output level determination signal TDOB1 if all the data in the memory macro are at the same level as that of the output level determination signal TDOB1. The intra-macro match determining circuit 111 outputs a level obtained by reversing the level of the output level determination signal TDOB1 if at least one of the data in the macro fails to match the output level determination signal TDOB1.

The intra-macro and inter-macro match determining unit 4m1 (m=2 to 7) outputs only the intra-macro and inter-macro match signal TDODm. If the intra-macro match signal TDOC1 and the intra-macro and inter-macro match signal TDODm (m=2 to 7) fail to match the expected values, the corresponding macro is defective. When the output level determination signal TDOB1 does not match the expected value, the memory macro 101 is surely defective. However, it is unknown whether or not the other memory macros are defective. It is thus necessary to subject the memory macro 101 to redundancy relief and then to perform the same measurement as that described above to check whether or not each of the memory macros 102 to 107 is defective. However, the probability that any of the memory macros 102 to 107 is defective is very low.

Although the present embodiment is limited as described above, since the macros output the respective results, defective macros can be easily found. Provided that at most seven macros are mounted in the semiconductor device having the 8-bit test output terminals, the maximum required number of bits is eight, eliminating the need to increase the number of test terminals. Moreover, testing can be carried out using a test file with the same expected value as that for an individual macro testing.

When a memory macro positioned in the center of the plurality of memory macros is a comparison target memory macro which is subjected to match determination by one of intra-macro and inter-macro match determining units 421 to 471 and which outputs the test output signal that is the output level determination signal TDOB1 from the intra-macro match determining unit 211, it is possible to reduce the wiring resistance of a test output signal line to the intra-macro and inter-macro match determining unit located away from the intra-macro match determining unit 211. For example, if the plurality of memory macros are n memory macros arranged in the vertical or horizontal direction, when n is a even number, the memory macro outputting the test output signal that is the output level determination signal TDOB1 is preferably one of the n/2−1th to n/2+1th memory macros from the memory macro located at an end. When n is an odd number, the memory macro outputting the test output signal that is the output level determination signal TDOB1 is preferably one of the (n−1)/2th to (n+1)/2th memory macros from the memory macro located at the end.

Embodiment 3

Description will be given of a semiconductor device and a testing method thereof according to Embodiment 3 of the present invention.

Figure 6:
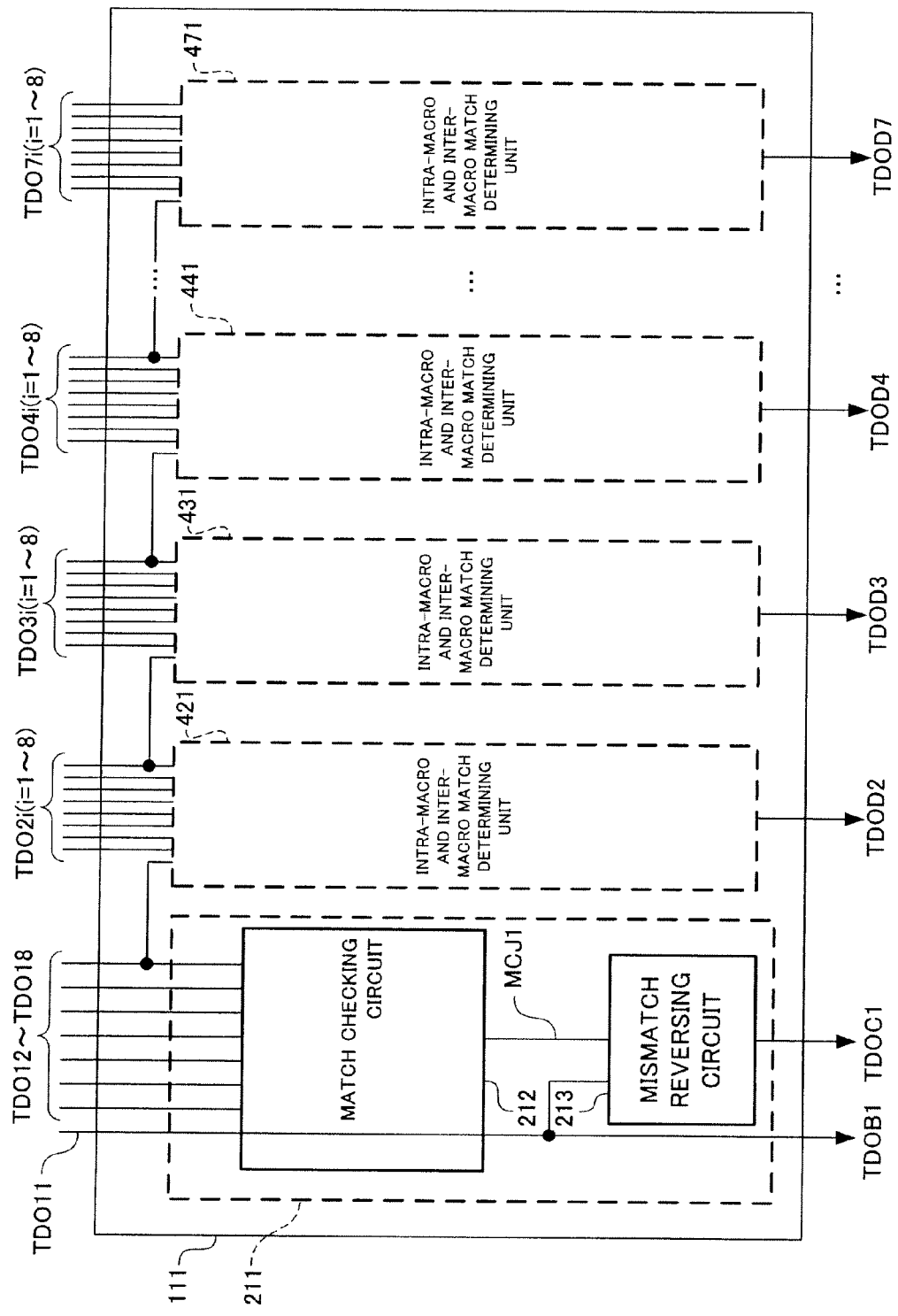
FIG. 6 is a block diagram showing the specific configuration of an intra-macro match determining circuit in a semiconductor device according to Embodiment 3 of the present invention.

FIG. 6 is a block diagram showing the specific configuration of an intra-macro match determining circuit in the semiconductor device according to Embodiment 3. The same circuits as those in Embodiments 1 and 2 are denoted by the same reference numerals as those in Embodiments 1 and 2. The illustration and description of these circuits are omitted.

An intra-macro match determining circuit 111 according to Embodiment 3 is made up of an intra-macro match determining unit 211 and six intra-macro and inter-macro match determining units 4m1 (m=2 to 7). Embodiment 3 is different from Embodiment 2 in that a macro terminal used to determine a match between macros corresponds to the adjacent macro. That is, test output signals TDO(m−1)8 and TDOm1 to TDOm8 are input to the intra-macro and inter-macro match determining unit 4m1.

The testing method of the semiconductor device according to Embodiment 3 is the same as that according to Embodiment 2 and will not be described. In Embodiment 2, the comparison target terminal is limited to one of the terminals of the reference macro. This increases the wiring resistance. However, in the testing method of the semiconductor according to Embodiment 3, the comparison target terminal is a terminal of the adjacent macro. This enables a reduction in the wiring resistance and space.

Embodiment 4

Description will be given of a semiconductor device and a testing method thereof according to Embodiment 4 of the present invention.

Figure 7:
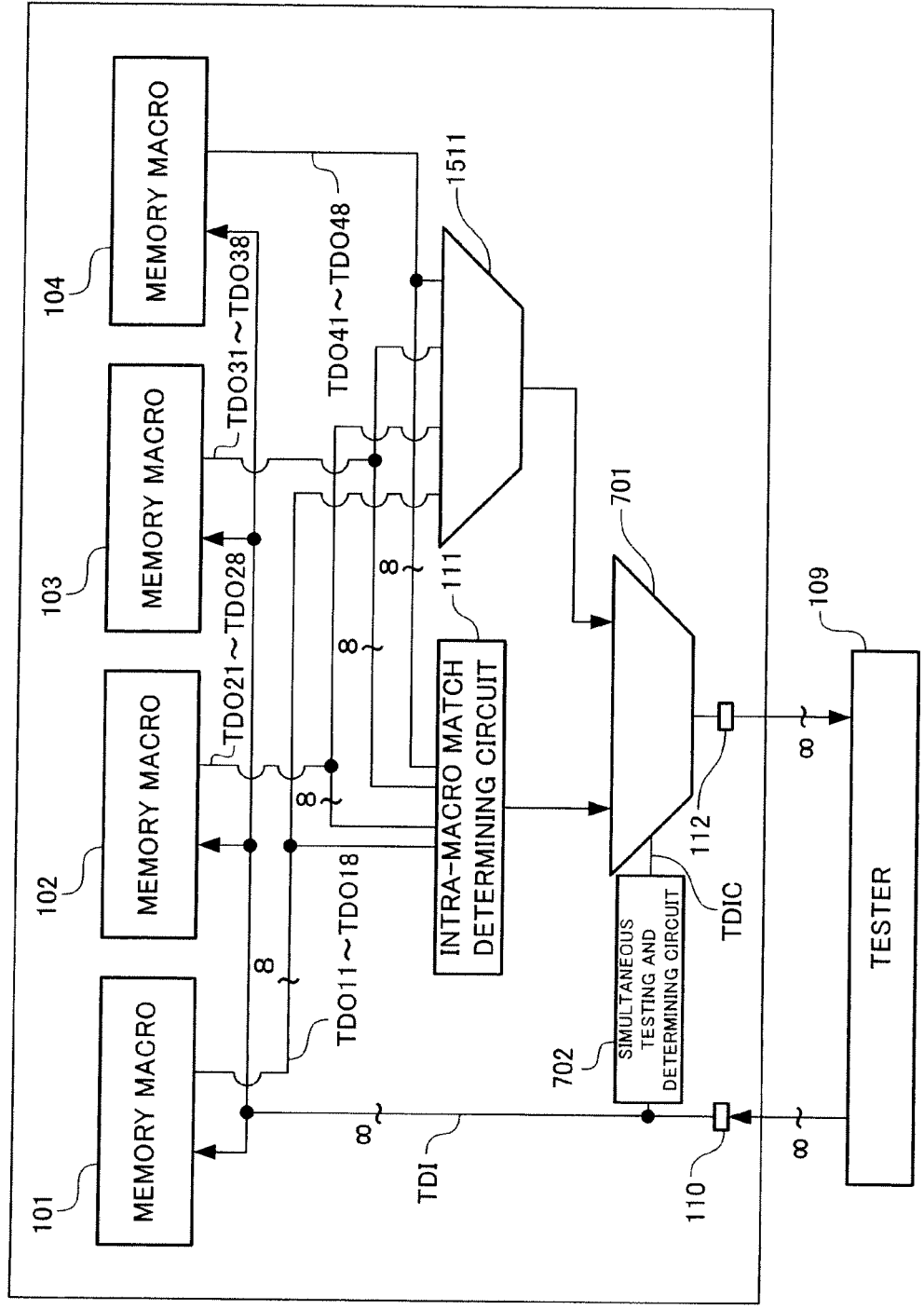
FIG. 7 is a block diagram showing the configuration of an essential part of a semiconductor device according to Embodiment 4 of the present invention.

FIG. 7 is a block diagram showing the configuration of an essential part of the semiconductor device according to Embodiment 4. The same circuits as those in Embodiment 1 are denoted by the same reference numerals as those in Embodiment 1. The illustration and description of these circuits are omitted. The semiconductor device according to Embodiment 4 is made up of the configuration of Embodiment 1, selectors 701 and 1511, and a simultaneous testing and determining circuit 702.

The selector 701 switchably connects one of an output from the selector 1511 and an output from an intra-macro match determining circuit 111 to a pad 112 in accordance with an output TDIC from the simultaneous testing and determining circuit 702. Outputs of memory macros 101 to 104 are connected to an input of the selector 1511 as described above in the conventional example to allow the selector 1511 to select one of the outputs.

Figure 8:
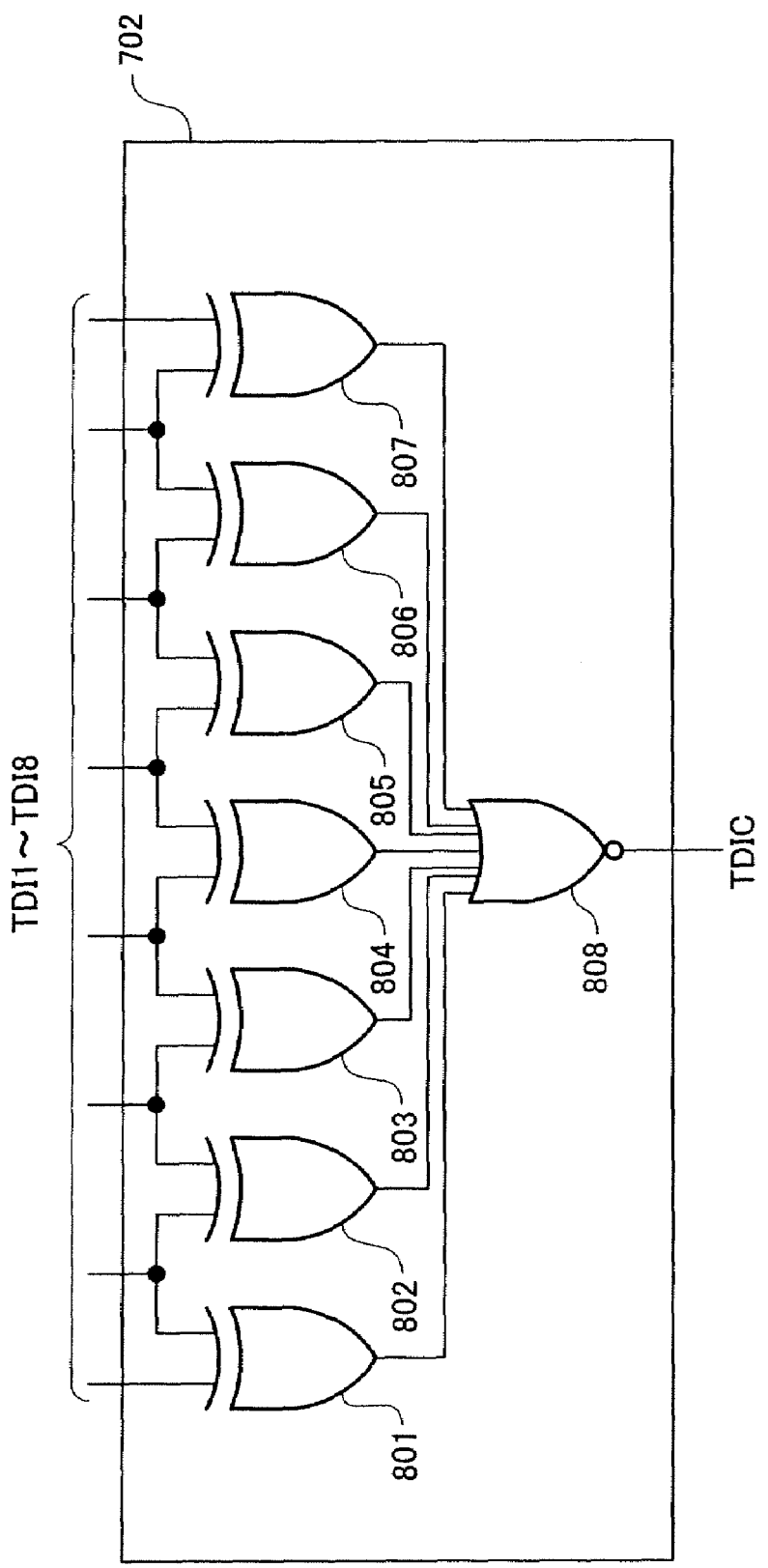
FIG. 8 is a circuit diagram showing the specific configuration of a simultaneous testing and determining circuit in the semiconductor device according to Embodiment 4.

FIG. 8 shows a circuit diagram of the simultaneous testing and determining circuit 702. The simultaneous testing and determining circuit 702 is composed of seven XOR circuits 801 to 807 and an NOR circuit 808. An input of the XOR circuit 80$i$ is connected to test input signals TDIi and TDI(i+1) (i=1 to 7). An output of the XOR circuit 80$i$ is connected to the NOR circuit 808. The NOR circuit 808 outputs the simultaneous testing and determination signal TDIC.

The testing method of the semiconductor device configured as described above according to Embodiment 4, using the test circuit, is shown below. Also for the testing method, overlapping descriptions of Embodiments 4 and 1 are similar and will thus not be described below.

When the test input signals TDIi (i=1 to 8) are at the same level, the simultaneous testing and determining circuit 702 outputs a high level as the simultaneous testing and determination signal TDIC. The selector 701 connects the output from the intra-macro match determining circuit 111 to the pad 112. On the other hand, when at least one of the test input signals TDIi (i=1 to 8) is at a level different from that of the other test input signals, the simultaneous testing and determining circuit 702 outputs a low level as the simultaneous testing and determination signal TDIC. The selector 701 connects the output from the selector 1511 to the pad 112.

Thus, when at least one of the test input signals TDIi (i=1 to 8) is at the level different from that of the other test input signals, an individual macro testing can be automatically selected and performed as in the prior art without performing a simultaneous macro testing.

Embodiment 5

Description will be given of a semiconductor device and a testing method thereof according to Embodiment 5 of the present invention.

Figure 9:
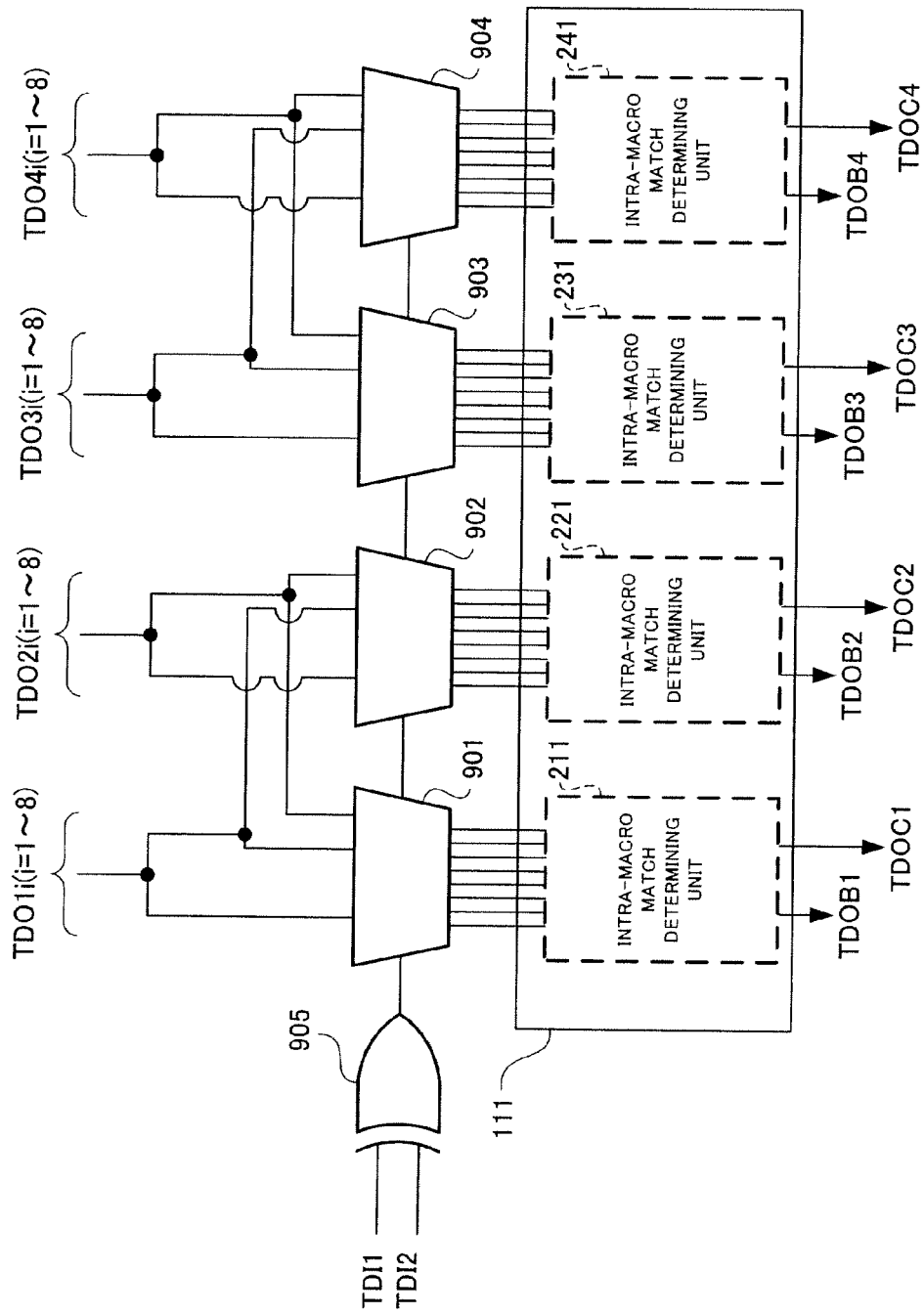
FIG. 9 is a block diagram showing the specific configuration of a part of a semiconductor device according to Embodiment 5 of the present invention.

FIG. 9 is a block diagram showing the specific configuration of a part of the semiconductor device according to Embodiment 5. The same circuits as those in Embodiment 1 are denoted by the same reference numerals as those in Embodiment 1. The illustration and description of these circuits are omitted. Embodiment 5 is different from Embodiment 1 in that a selector 90$m$ (m=1 to 4) and an XOR circuit 905 are provided between an intra-macro match determining circuit 111 and test output signals TDO1$i$ to TDO4$i$ (i=1 to 8), which are outputs from memory macros 101 to 104.

The test output signal TDO1$i$ and the set of the test output signals TDO1$i$ and TDO2$i$ (i=1, 3, 5, or 7) are input to the selector 901. The selector 901 outputs the test output signal TDO1$i$ or the set of the test output signals TDO1$i$ and TDO2$i$ (i=1, 3, 5, or 7) depending on an output from the XOR circuit 905.

The test output signal TDO2$i$ and the set of the test output signals TDO1$i$ and TDO2$i$ (i=2, 4, 6, or 8) are input to the selector 902. The selector 902 outputs the test output signal TDO2$i$ or the set of the test output signals TDO1$i$ and TDO2$i$ (i=2, 4, 6, or 8) depending on the output from the XOR circuit 905.

The test output signal TDO3$i$ and the set of the test output signals TDO3$i$ and TDO4$i$ (i=1, 3, 5, or 7) are input to the selector 903. The selector 903 outputs the test output signal TDO3$i$ or the set of the test output signals TDO3$i$ and TDO4$i$ (i=1, 3, 5, or 7) depending on the output from the XOR circuit 905.

The test output signal TDO4$i$ and the set of the test output signals TD03$i$ and TD04$i$ (i=2, 4, 6, or 8) are input to the selector 904. The selector 904 outputs the test output signal TDO4$i$ or the set of the test output signals TD03$i$ and TD04$i$ (i=2, 4, 6, or 8) depending on the output from the XOR circuit 905. The test input signals TDI1 and TDI2 are input to the XOR circuit 905.

The testing method of the semiconductor device configured as described above according to Embodiment 5, using the test circuit, is shown below. Also for the method, overlapping descriptions of Embodiments 5 and 1 are similar and will thus not be described below. The test input signal TDI1 is always at the same level as that of the signal TDIi (i=3, 5, or 7). The test input signal TDI2 is always at the same level as that of the signal TDIi (i=4, 6, or 8).

When the test input signals TDI1 and TDI2 are at the same level, the output from the XOR circuit 905 is at a low level. The selector 90$m$ (m=1 to 4) outputs the test output signal TDOmi (i=1 to 8).

When the test input signals TDI1 and TDI2 are at different levels, the output from the XOR circuit 905 is at a high level. The selector 9(2$j$−1)1 (j=1 to 2) outputs test output signals TDO(2$j$−1)$i$ and TDO(2$j$)$i$ (i=1, 3, 5, or 7). The selector 9(2$j$)1 (j=1 to 2) outputs test output signals TDO(2$j$−1)$i$ and TDO(2$j$)$i$ (i=2, 4, 6, or 8).

This enables a simultaneous macro testing to be performed even with different input signals. That is, defective macros can be detected using two sets of output level determination signal TDOBm and intra-macro match signal TDOCm from a set of two macros.

Embodiment 6

Description will be given of a semiconductor device and a testing method thereof according to Embodiment 6 of the present invention.

Figure 10:
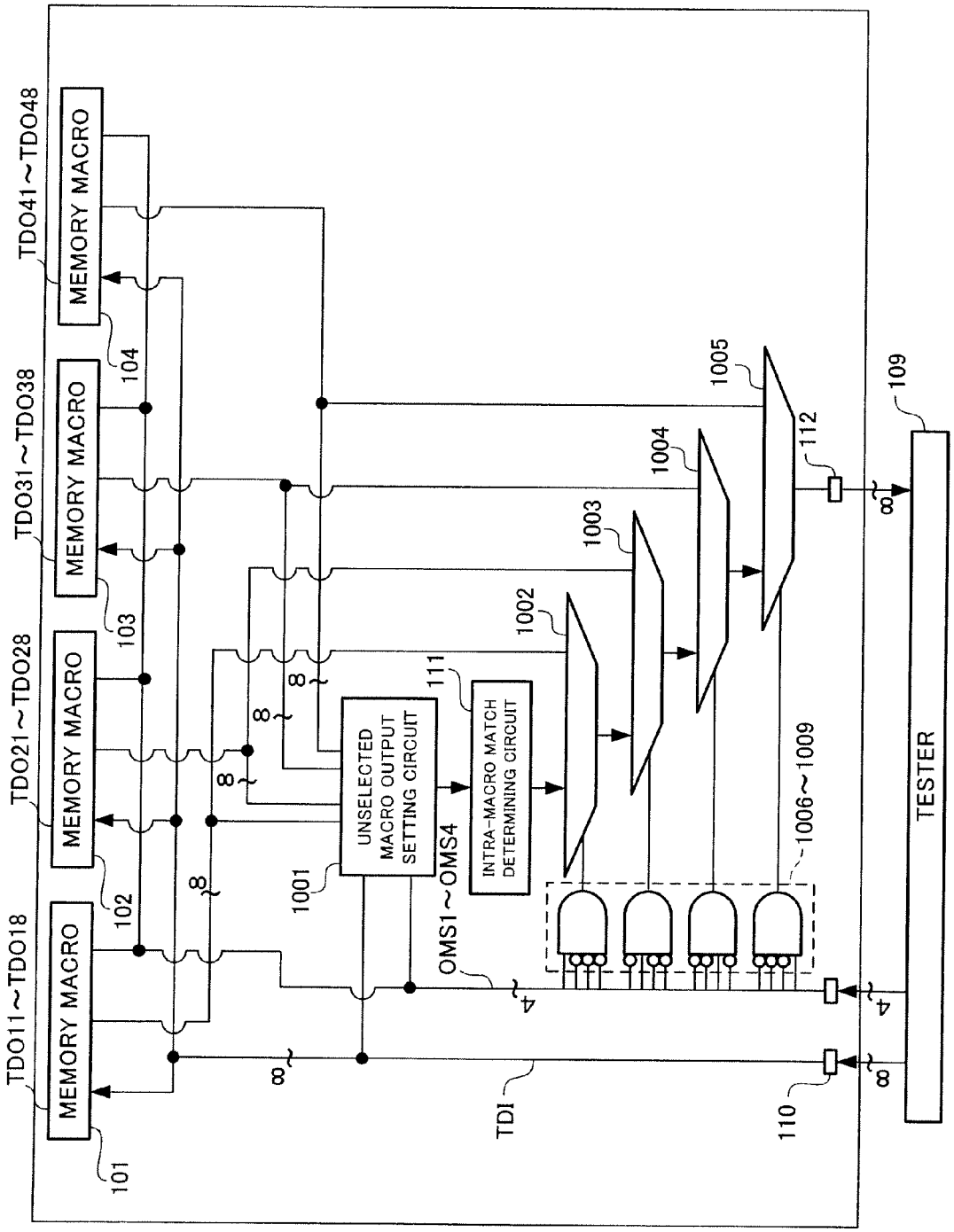
FIG. 10 is a block diagram showing the configuration of an essential part of a semiconductor device according to Embodiment 6 of the present invention.

FIG. 10 is a block diagram showing the configuration of an essential part of the semiconductor device according to Embodiment 6. Embodiment 6 is different from Embodiment 1 in that selectors 1002 to 1005 and AND circuits 1006 to 1009 are provided between an output of an intra-macro match determining circuit 111 and a pad 112 and in that an unselected macro output setting circuit 1001 is provided between an input of the intra-macro match determining circuit 111 and memory macros 101 to 104. Moreover, a tester 109 inputs output macro selection signals OMS1 to OMS4 to the semiconductor device.

Figure 11:
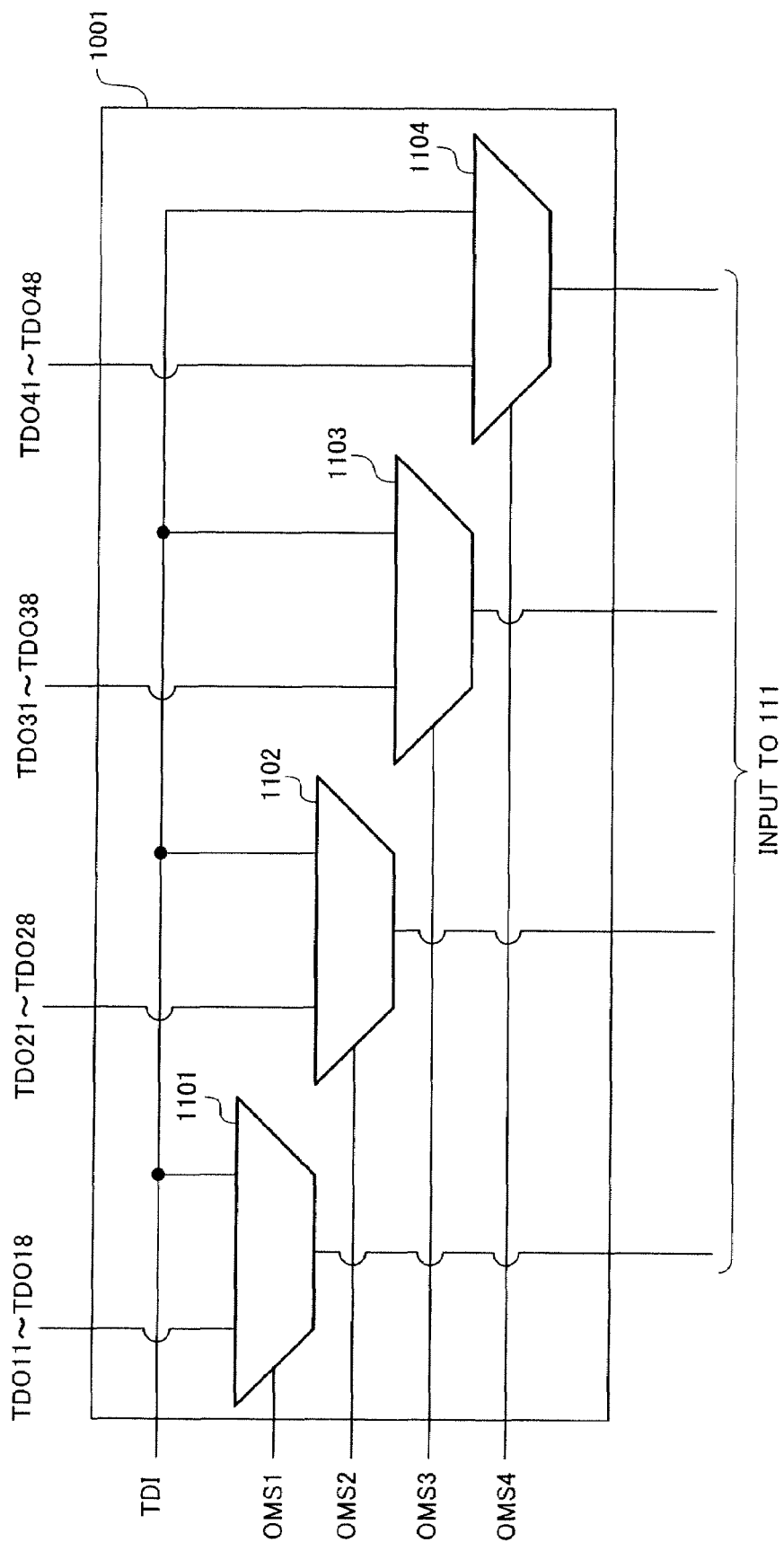
FIG. 11 is a circuit diagram showing the specific configuration of an unselected macro output setting circuit in the semiconductor device according to Embodiment 6.

As shown in FIG. 11, a test input signal TDIi (i=1 to 8), the output macro selection signals OMS1 to OMS4, and test output signals TDO1$i$ to TDO4$i$ (i=1 to 8) are input to the unselected macro output setting circuit 1001. An output of the unselected macro output setting circuit 1001 is connected to the intra-macro match determining circuit 111.

Depending on an output from the AND circuit 1006, the selector 1002 outputs one of the output from the intra-macro match determining circuit 111 and the test output signal TDO1$i$ (i=1 to 8). Depending on an output from the AND circuit 100$j$(+4), the selector 100$j$ (j=3 to 5) outputs one of an output from the selector 100(j−1) and the test output signal TDO(j−1)$i$ (i=1 to 8).

The output of the selector 1005 is connected to the pad 112, so that the output from the selector 1005 is output to the tester 109. An input to the AND circuit 100($j$+4) is data obtained by reversing the output macro selection signals OMS1 to OMS4 other than OMS(j−1). The data OMS(j−1) is used without being reversed.

FIG. 11 is a circuit diagram of the unselected macro output setting circuit 1001. The unselected macro output setting circuit 1001 is composed of four selectors 1101 to 1104. The selector 110$m$ outputs the test output signals TDOm1 to TDOm8 or the test input signal TDIi (i=1 to 8) depending on the output macro selection signal OMSm.

The testing method of the semiconductor device configured as described above according to Embodiment 6, using the test circuit, is shown below. Also for the method, overlapping descriptions of Embodiments 6 and 1 are similar and will thus not be described below.

After the tester 109 sets the output macro selection signals OMS1 to OMS4, when the output macro selection signal OMSm is at a high level, the selector 110$m$ outputs the test output signals TDOm1 to TDOm8. When the output macro selection signal OMSm in the unselected state is at a low level, the selector 110$m$ outputs the test input signal TDIi (i=1 to 8). The selector 110$m$ is prevented from making the unselected macro defective.

Furthermore, if only one macro is selected, the data need not be compressed. Thus, the selectors 1002 to 1005 are used to directly output data from one macro. If only one macro is selected (here, the memory macro 10$m$), then only one of the AND circuits is at a high level, and the corresponding selector 100$m$ outputs the test output signals TDOm1 to TDOm8. If at least two macros are selected, the intra-macro match determining circuit 111 outputs the data compressed as usual.

Thus, a plurality of macros can be freely selected and simultaneously tested.

Embodiment 7

Description will be given of a semiconductor device and a testing method thereof according to Embodiment 7 of the present invention.

Figure 12:
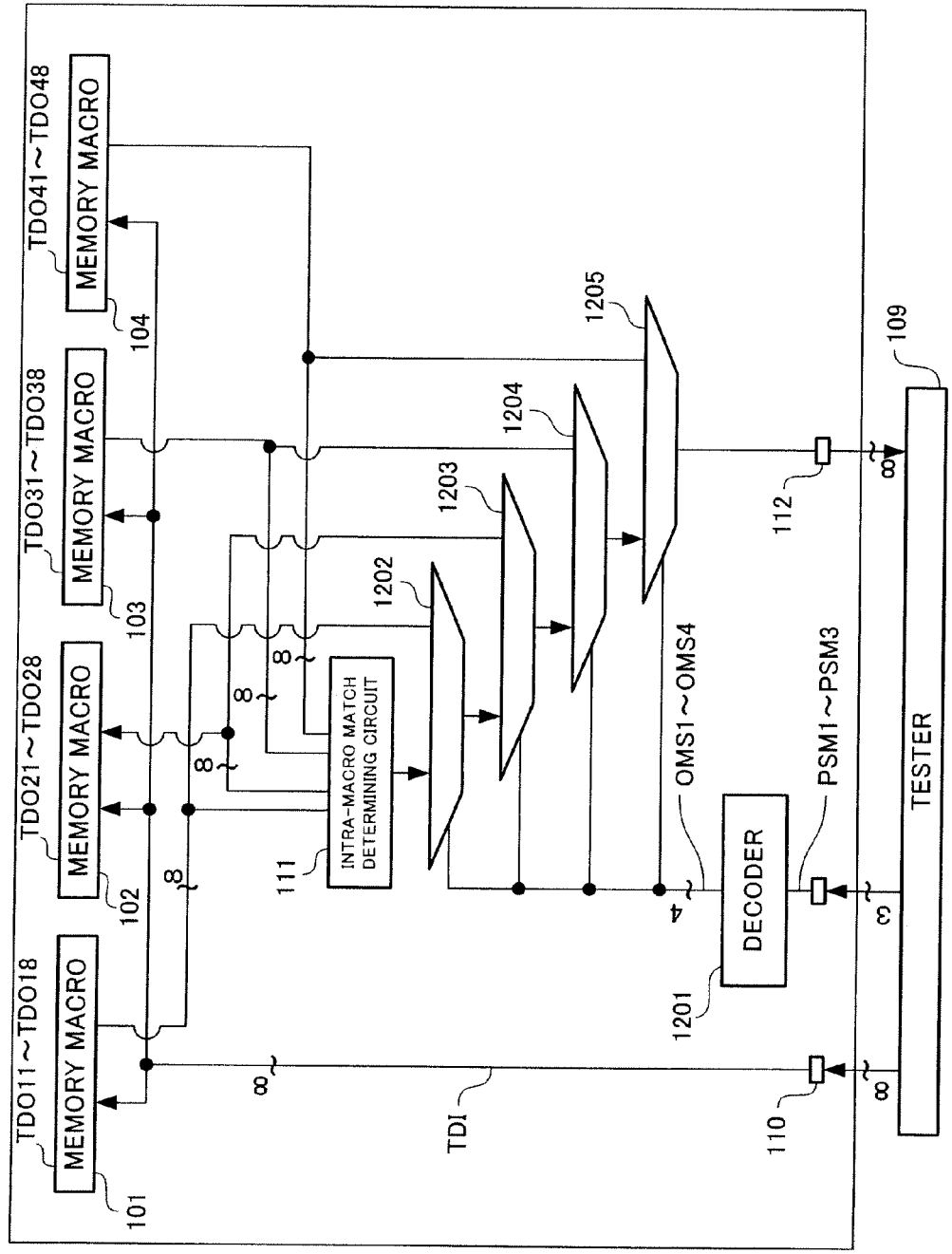
FIG. 12 is a block diagram showing the configuration of an essential part of a semiconductor device according to Embodiment 7 of the present invention.

FIG. 12 is a block diagram showing the configuration of an essential part of the semiconductor device according to Embodiment 7. Embodiment 7 is different from Embodiment 1 in that a decoder 1201 and selectors 1202 to 1205 are provided between an output of an intra-macro match determining circuit 111 and a pad 112.

Output macro selection pre-signals PSM1 to PSM3 are input to the decoder 1201. Output macro selection signals OMS1 to OMS4 that are outputs from the decoder 1201 are connected to the selectors 1202 to 1205, respectively. Depending on the output of the output macro selection signal OMS1, the selector 1202 outputs one of the output from the intra-macro march determining circuit 111 and a test output signal TDO1$i$ (i=1 to 8).

Depending on the output of the output macro selection signal OMSm, the selector 120(m+1) (m=2 to 4) outputs one of the output from the selector 120$m$ and the test output signal TDOmi (i=1 to 8).

Figure 13:
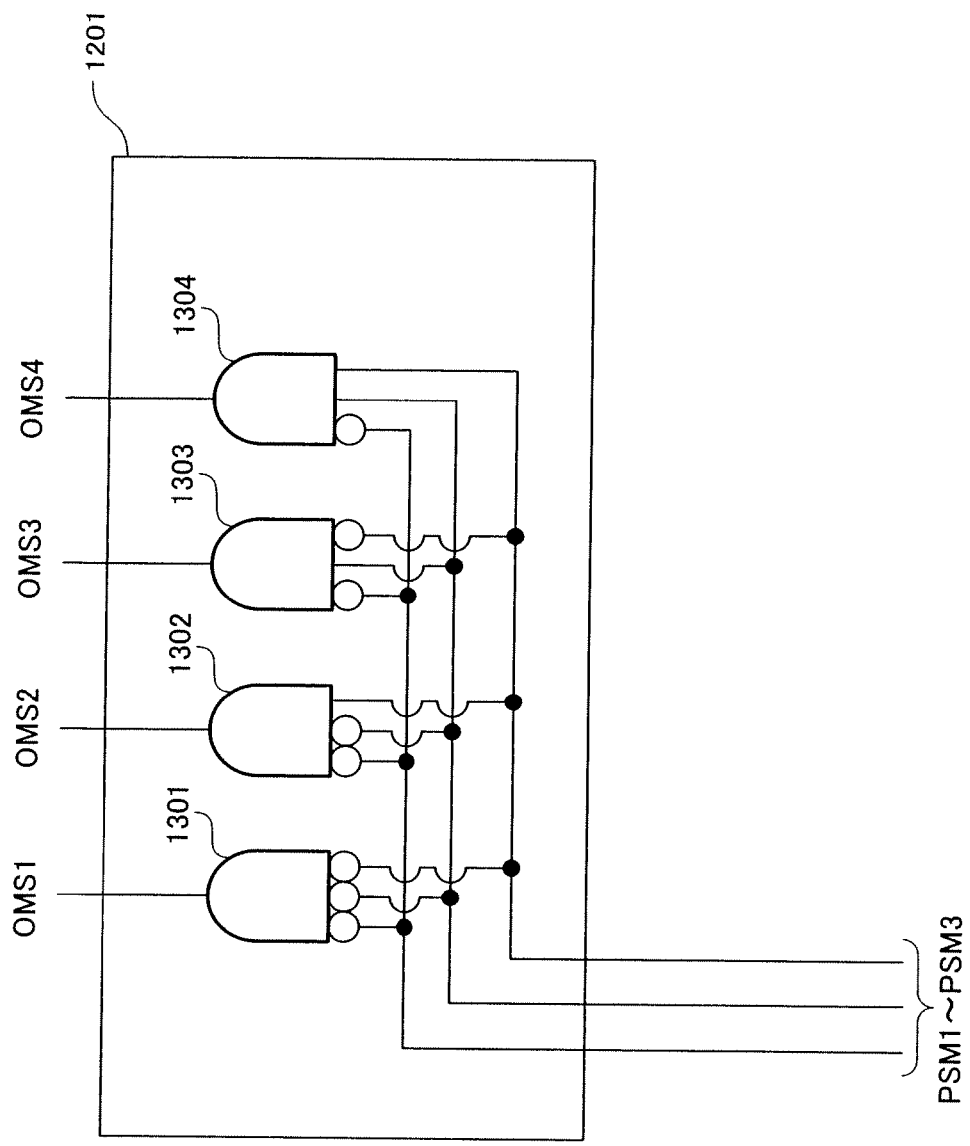
FIG. 13 is a circuit diagram showing the specific configuration of a decoder in the semiconductor device according to Embodiment 7 of the present invention.
Figure 14:
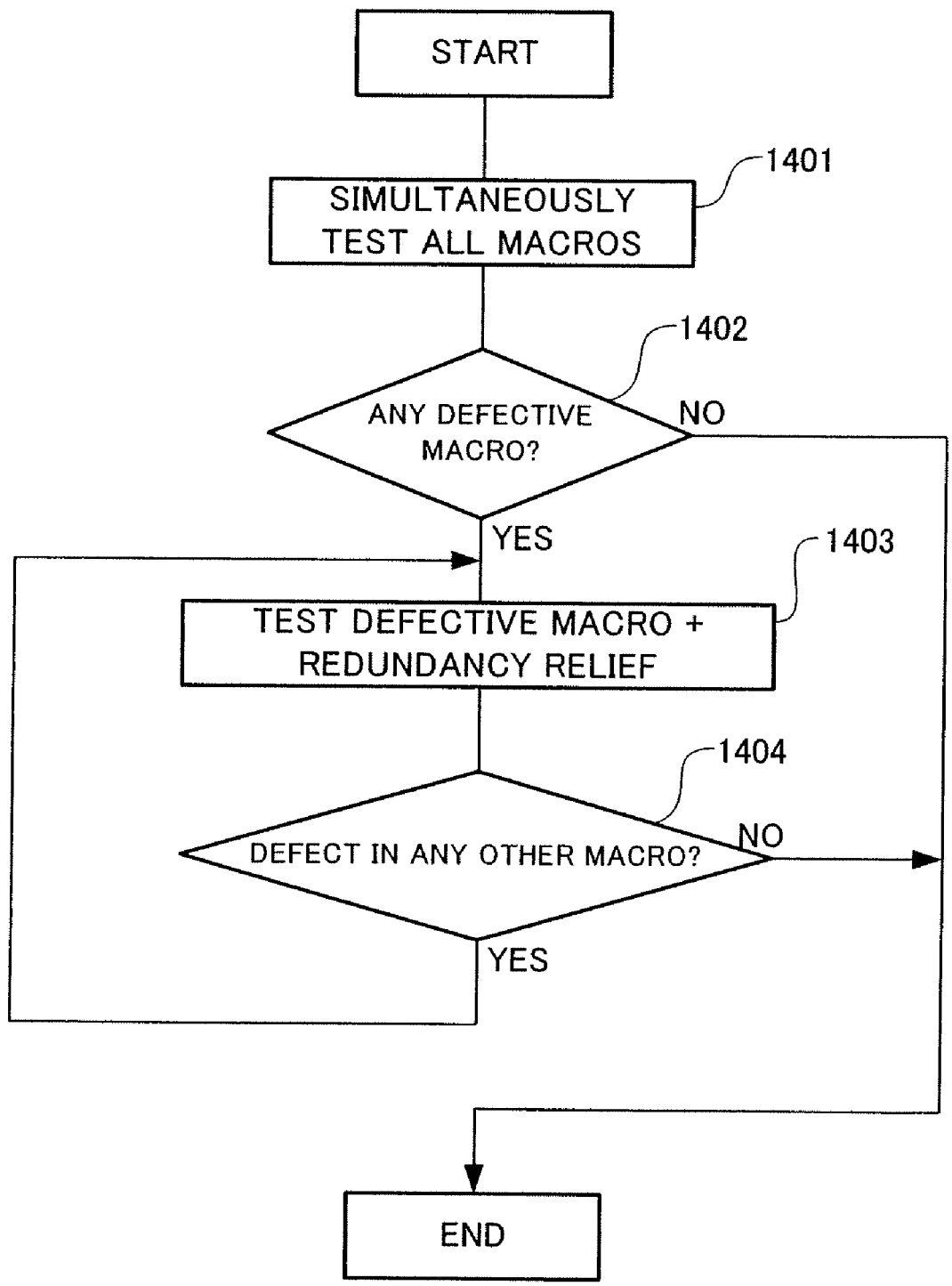
FIG. 14 is a flowchart showing the procedure of a testing method of the semiconductor device according to Embodiment 7.
Figure 15:
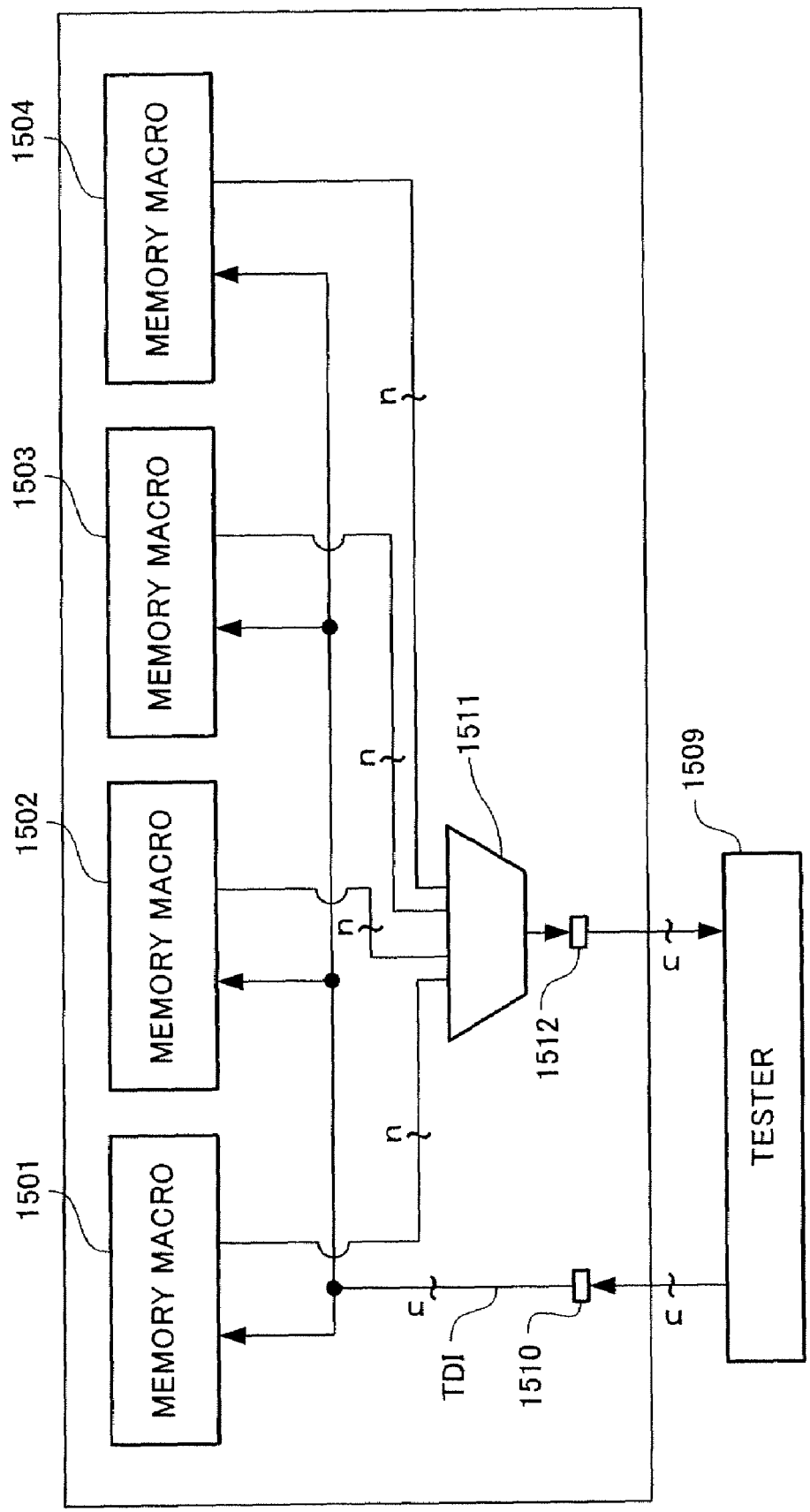
FIG. 15 is a block diagram showing the configuration of an essential part of a semiconductor memory in conventional example 1 (testing is performed on each memory macro)
Figure 16:
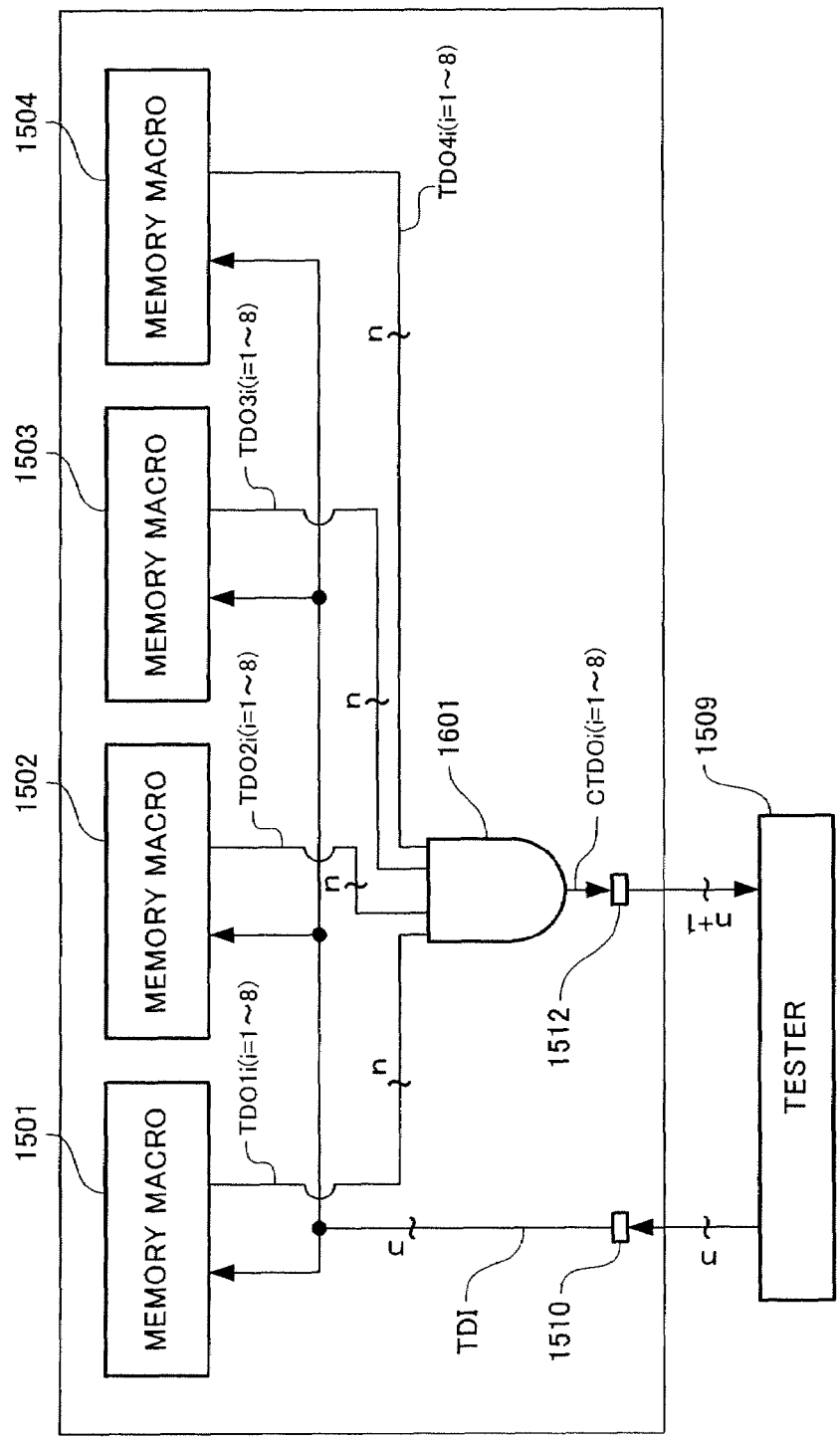
FIG. 16 is a block diagram showing the configuration of an essential part of a semiconductor memory in conventional example 2 (a plurality of memory macros are simultaneously tested).

FIG. 13 shows a circuit diagram of the decoder 1201. The decoder 1201 is composed of four AND circuits 1301 to 1304.

Reversal data of all the output macro selection pre-signals PSM1 to PSM3 are input to the AND circuit 1301, which outputs the output macro selection signal OMS1. The reversal data of the output macro selection pre-signals PSM1 and PSM2 as well as the output macro selection pre-signal PSM3 are input to the AND circuit 1302, which outputs the output macro selection signal OMS2. The reversal data of the output macro selection pre-signals PSM1 and PSM3 as well as the output macro selection pre-signal PSM2 are input to the AND circuit 1303, which outputs the output macro selection signal OMS3. The reversal data of the output macro selection pre-signal PSM1 as well as the output macro selection pre-signals PSM2 and PSM3 are input to the AND circuit 1304, which outputs the output macro selection signal OMS4.

The testing method of the semiconductor device configured as described above according to Embodiment 7, using the test circuit, is shown below. FIG. 4 shows a flow of the testing method. Also for the method, overlapping descriptions of Embodiments 7 and 1 are similar and will thus not be described below.

When a tester 109 performs function testing on a certain pattern, first, macro testing is simultaneously performed on all macros (step 1401). Subsequently, the tester internally determines a defective macro exhibiting a value different from the expected value (step 1402). The tester then sends a signal encoded to select one macro to the decoder 1201. Thus, individual macro testing is performed for redundancy relief (step 1403). When the testing of one macro is completed, the tester 109 internally determines whether or not any other macro is defective (step 1404). If any other macro is defective, the individual macro testing is performed again for redundancy relief (step 1403). This operation is repeated, and when no other defective macro is detected, the process shifts to the function testing on the next pattern.

This method enables a reduction in the duration of the testing compared to the individual testing except for the case in which all the macros are defective.

What is claimed is:

1. A semiconductor device comprising:
   a plurality of memory macros; and
   an intra-macro match determining unit outputting an intra-macro match signal corresponding to at least one of the plurality of memory macros and comparing test output data from the memory macro to determine whether or not the test output data match, the intra-macro match determining unit outputting some of the test output data from the memory macro as an output level determination signal used to determine level of the match,
   wherein a logic of the intra-macro match signal is determined on a basis of a logic of the output level determination signal according to a state of the match between the test output data from the memory macro.

2. The semiconductor device according to claim 1, wherein the intra-macro match determining unit is provided in each of the plurality of memory macros.

3. The semiconductor device according to claim 1, wherein the intra-macro match signal has the same logical value as that of the output level determination signal when the test output data from the memory macro match, and has a logical value corresponding to a reversal value of the output level determination signal when the test output data from the memory macro does not match.

4. The semiconductor device according to claim 1, further comprising an intra-macro and inter-macro match determining unit outputting an intra-macro and inter-macro match signal corresponding to each of the memory macros other than the at least one memory macro and comparing the test output data from the at least one memory macro with at least one of the test output data from a comparison target memory macro that is different from the at least one memory macro to determine whether or not the test output data from the at least one memory macro match the test output data from the comparison target memory macro,
   wherein a logic of the intra-macro and inter-macro match signal is determined on the basis of the logic of the output level determination signal according to a state of match between the test output data from the at least one memory macro and the test output data from the comparison target memory macro.

5. The semiconductor device according to claim 4, wherein the intra-macro and inter-macro match signal has the same logical value as that of the output level determination signal when the test output data from the memory macro match the test output data from the comparison target memory macro, and has a logical value corresponding to a reversal value of the output level determination signal when the test output data from the memory macro does not match the test output data from the comparison target memory macro.

6. The semiconductor device according to claim 4, wherein the test output data from the comparison target memory macro subjected to match determination by the intra-macro and inter-macro match determining unit is some of the test output data from the memory macro which is output by the intra-macro match determining unit as the output level determination signal.

7. The semiconductor device according to claim 4, wherein the comparison target memory macro is positioned in a center of the plurality of memory macros.

8. The semiconductor device according to claim 4, wherein the test output data from the comparison target memory macros subjected to match determination by the intra-macro and inter-macro match determining unit is nearby test output data output from an adjacent memory macro.

9. The semiconductor device according to claim 1, further comprising a first selector selecting the test output data from one of the plurality of memory macros; and a second selector selecting from the test output data selected by the first selector and output signals from the plurality of intra-macro match determining units, in accordance with test input data.

10. The semiconductor device according to claim 1, wherein as the test output data input to each of the plurality of intra-macro match determining units, the test output data from at least one of the plurality of memory macros is selected.

11. The semiconductor device according to claim 10, further comprising a selector switching the test output data from the plurality of memory macros in accordance with the test input data in order to perform the selection of the test output data input to each of the plurality of intra-macro match determining units.

12. The semiconductor device according to claim 1, further comprising an unselected macro output setting circuit selecting from the test output data from each of the plurality of memory macros and the test input data in accordance with an output macro selection signal as the test output data input to each of the plurality of intra-macro match determining units, wherein the unselected macro output setting circuit selects the test input data as the test output data input to the intra-macro match determining units corresponding to the unselected memory macros, in accordance with the output macro selection signal.

13. The semiconductor device according to claim 12, further comprising a selector selecting output signals from the plurality of intra-macro match determining units if the plurality of memory macros are selected by the output macro selection signal, and selecting the test output data from the one memory macro if only one of the memory macros is selected by the output macro selection signal.

14. The semiconductor device according to claim 1, further comprising a decoder generating an output macro selection signal selecting any one of the plurality of memory macros on a basis of an output macro selection pre-signal comprising bits the number of which is smaller than that of all the memory macros; and a selector selecting output signals from one of the plurality of intra-macro match determining units or the test output data from the selected memory macro in accordance with the output macro selection signal from the decoder.

15. A testing method of the semiconductor device according to claim 14, comprising the steps of:

using a tester to simultaneously test all of a plurality of memory macros on a basis of the output signals from a plurality of intra-macro match determining units;

allowing the tester to internally perform a comparison with an expected value that is a threshold for determining acceptability of the memory macros;

selecting only the memory macro determined to have a defect on a basis of a result of the comparison, in accordance with an output macro selection signal; and on a basis of test output data from the selected memory macro, individually testing only the selected memory macro for redundancy relief.

16. The semiconductor device according to claim 4, wherein the plurality of memory macros are n (n is an even number) memory macros arranged in one of a vertical direction and a horizontal direction, and the at least one of the plurality of memory macros is one of n/2−1th to n/2+1th memory macros from the memory macro located at an end.

17. The semiconductor device according to claim 4, wherein the plurality of memory macros are n (n is an odd number) memory macros arranged in one of a vertical direction and a horizontal direction, and the at least one of the plurality of memory macros is one of (n−1)/2th to (n+1)/2th memory macros from the memory macro located at an end.

* * * * *